(12) United States Patent
Jo et al.

(10) Patent No.: US 11,619,885 B2
(45) Date of Patent: Apr. 4, 2023

(54) MASK CHUCK AND MASK MANUFACTURING APPARATUS INCLUDING SAME

(71) Applicant: Samsung Display Co., Ltd., Yongin-si (KR)

(72) Inventors: Junho Jo, Seoul (KR); Youngho Park, Suwon-si (KR); Seungyong Song, Suwon-si (KR); Youngchul Lee, Cheonan-si (KR); Youngsuck Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/677,188

(22) Filed: Feb. 22, 2022

(65) Prior Publication Data

US 2022/0179322 A1    Jun. 9, 2022

Related U.S. Application Data

(62) Division of application No. 17/198,469, filed on Mar. 11, 2021, now Pat. No. 11,287,749.

(30) Foreign Application Priority Data

Jul. 23, 2020   (KR) ........................ 10-2020-0091547

(51) Int. Cl.
   *G03F 7/20*   (2006.01)
(52) U.S. Cl.
   CPC .......... *G03F 7/707* (2013.01); *G03F 7/70716* (2013.01); *G03F 7/70775* (2013.01); *G03F 7/70866* (2013.01)

(58) Field of Classification Search
   CPC .. G03F 7/707; G03F 7/70716; G03F 7/70775; G03F 7/70866; C23C 14/042;
   (Continued)

(56) References Cited

U.S. PATENT DOCUMENTS 4,557,568 A    12/1985  Van Benschoten
5,847,813 A *  12/1998  Hirayanagi ......... G03F 7/70708
                                                    355/75

(Continued)

FOREIGN PATENT DOCUMENTS

KR    1020170056769 A    5/2017
KR    1020200004115 A    1/2020
(Continued)

*Primary Examiner* — Hung V Nguyen
(74) *Attorney, Agent, or Firm* — Cantor Colburn LLP

(57) ABSTRACT

A mask chuck may include a base plate including a central region and an edge region surrounding the central region, a head part including a first surface connected to the edge region of the base plate and configured to move on the edge region to be close to the central region or away from the central region, and a pad part disposed on a second surface of the head part opposite to the first surface of the head part. The edge region may include a first edge region extending in a first direction, a second edge region extending in the first direction and spaced apart from the first edge region in a second direction crossing the first direction, a third edge region extending in the second direction, and a fourth edge region extending in the second direction and spaced apart from the third edge region in the first direction.

1 Claim, 14 Drawing Sheets

(58) Field of Classification Search
CPC ............. C23C 16/042; H01L 21/67011; H01L 21/68778; H01L 51/56; H01L 51/0011
See application file for complete search history.

(56) References Cited

U.S. PATENT DOCUMENTS

| | | | |
|---|---|---|---|
| 8,189,167 B2* | 5/2012 | Byun | G03F 7/2014 |
| | | | 349/190 |
| 9,847,485 B2 | 12/2017 | Min | |
| 2003/0142284 A1 | 7/2003 | Lin | |
| 2008/0012431 A1 | 1/2008 | Williams et al. | |
| 2008/0236997 A1* | 10/2008 | Ebihara | G03F 7/709 |
| | | | 198/618 |

FOREIGN PATENT DOCUMENTS

| | | |
|---|---|---|
| KR | 1020200009616 A | 1/2020 |
| KR | 1020200009799 A | 1/2020 |

\* cited by examiner

MASK CHUCK AND MASK MANUFACTURING APPARATUS INCLUDING SAME

This application is a divisional of U.S. patent application Publication Ser. No. 17/198,469, filed on Mar. 11, 2021, which claims priority to Korean Patent Application No. 10-2020-0091547, filed on Jul. 23, 2020, and all the benefits accruing therefrom under 35 U.S.C. § 119, the content of which in its entirety is herein incorporated by reference.

BACKGROUND

1. Field

Embodiments of the invention herein relate to a mask chuck and a mask manufacturing apparatus including the same, and more particularly, to a mask chuck configured to stretch a mask in which deposition holes are defined therein and dispose the mask on a mask frame, and to a mask manufacturing apparatus.

2. Description of the Related Art

Display panels include a plurality of pixels. The plurality of pixels each includes a driving element such as a transistor and a display element such as an organic light-emitting diode. The display element may be formed on a substrate by laminating electrodes and light-emitting patterns on the substrate. The light-emitting patterns are patterned using a mask in which holes are defined therein so as to be defined in a predetermined region. The light-emitting patterns may be provided in a region exposed by an opening.

Recently, in order to enhance the production yield of the display panels, equipment and methods for manufacturing large-area masks are being developed.

SUMMARY

An embodiment of the invention provides a mask chuck including a base plate including a central region and an edge region surrounding the central region, a head part including a first surface connected to the edge region of the base plate and configured to move on the edge region so as to be close to the central region or away from the central region, and a pad part disposed on a second surface of the head part which is opposite to the first surface of the head part. The edge region includes a first edge region extending in a first direction, a second edge region extending in the first direction and spaced apart from the first edge region in a second direction crossing the first direction, a third edge region extending in the second direction, and a fourth edge region extending in the second direction and spaced apart from the third edge region in the first direction. The head part includes a first head part disposed in the first edge region and extending in the first direction, a second head part disposed in the second edge region and extending in the first direction, a third head part disposed in the third edge region and extending in the second direction, and a fourth head part disposed in the fourth edge region and extending in the second direction.

In an embodiment of the invention, a mask manufacturing apparatus includes a stage on which a mask frame in which a cell opening defined is disposed, a mask chuck disposed on the stage and configured to dispose a cell mask on a first surface of the mask frame adjacent to the cell opening, and an intense-light emitting apparatus configured to irradiate an intense light on a portion between the mask frame and the cell mask. The mask chuck includes a base plate including a central region and an edge region surrounding the central region, a head part connected to the edge region of the base plate and configured to move on the edge region so as to be close to the central region or away from the central region, and a pad part disposed on a first surface of the head part. The edge region includes a first edge region extending in a first direction, a second edge region extending in the first direction and spaced apart from the first edge region in a second direction crossing the first direction, a third edge region extending in the second direction, and a fourth edge region extending in the second direction and spaced apart from the third edge region in the first direction. The head part includes a first head part disposed in the first edge region and extending in the first direction, a second head part disposed in the second edge region and extending in the first direction, a third head part disposed in the third edge region and extending in the second direction, and a fourth head part disposed in the fourth edge region and extending in the second direction.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
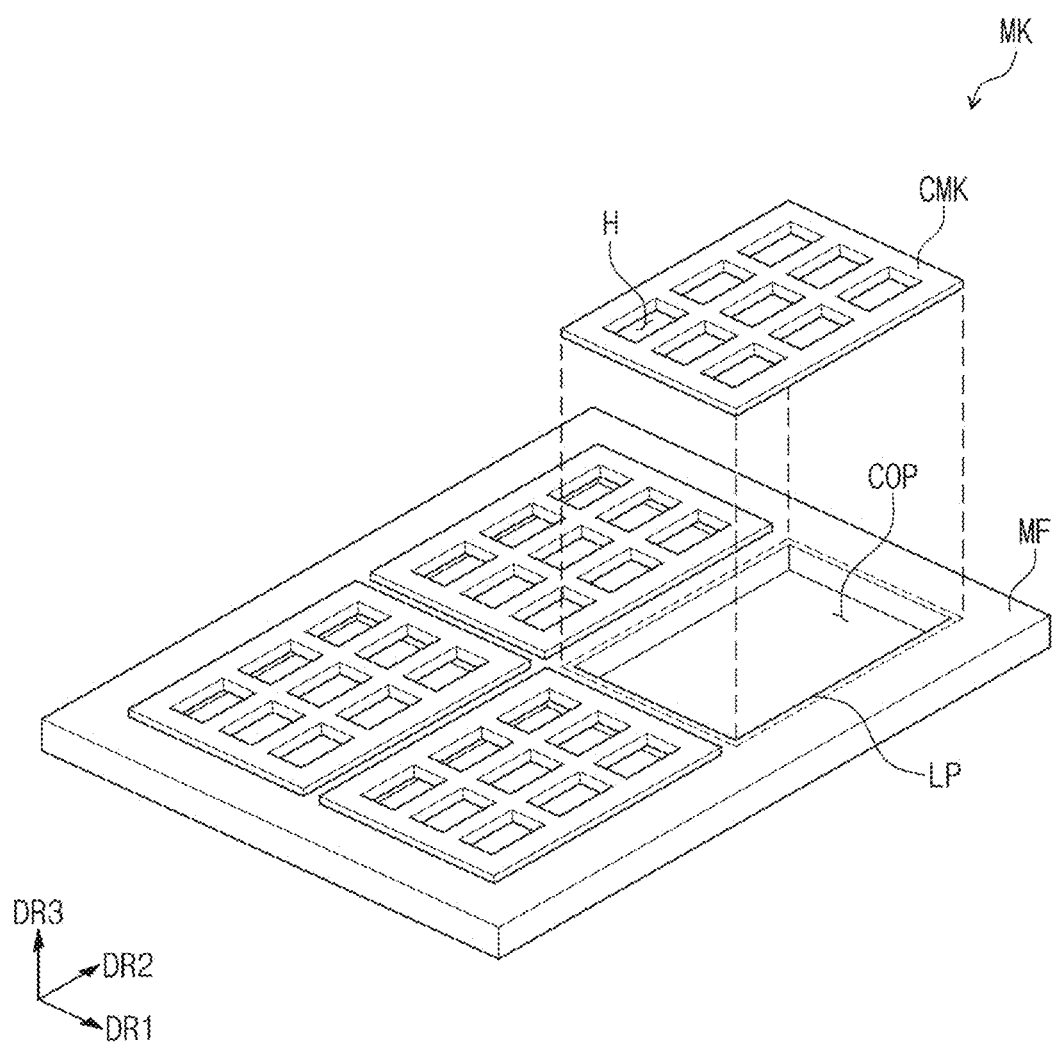
FIG. 1 is a view illustrating an embodiment of a mask assembly.

In this specification, it will be understood that when an element (or a region, a layer, portion, etc.) is referred to as being "on", "connected to" or "coupled to" another element or layer, it may be directly on, connected or coupled to the other element, or a third intervening element may be therebetween.

Like reference symbols refer to like elements. Also, in the drawing figures, the thicknesses, the ratios and the dimensions of elements are exaggerated for effective illustration of technological contents.

The term "and/or" includes all of one or more combinations that may be defined by associated items.

Although the terms such as "first" and "second" may be used herein to describe various elements, these elements should not be limited by these terms. The terms are only used to distinguish one element from other elements. For example, without departing from the scope of the present invention, a first component may be referred to as a second component, and similarly, the second component may also be referred to as the first component. Singular forms may include plural forms unless clearly defined otherwise in context.

In addition, terms such as "under", "below", "on", and "above" may be used to describe the relationship between elements illustrated in the drawing figures. The terms have relative concepts, and are described with respect to directions illustrated in the drawing figures.

Unless defined otherwise, all terms (including technical terms and scientific terms) used in this specification have the same meaning as that generally understood by those skilled in the art to which the invention belongs. It will be further understood that terms, such as those defined in commonly used dictionaries, should be interpreted as having a meaning that is consistent with their meaning in the context of the relevant art and will not be interpreted in an idealized or overly formal sense unless so defined herein.

It should be further understood that the terms "include" or "have", when used in this specification, specify the presence of stated features, numbers, steps, operations, elements, components or combinations thereof, but do not preclude the presence or addition of one or more other features, numbers, steps, operations, elements, components, and/or combinations thereof.

Hereinafter, embodiments will be described in detail with reference to the accompanying drawings.

FIG. 1 is a view illustrating an embodiment of a mask.

Referring to FIG. 1, a mask MK may be used for a process for manufacturing a display device. Specifically, the mask MK may be used for a process for depositing an organic light-emitting element layer on a deposition substrate of a display device.

The mask MK may have a quadrangular (e.g., rectangular) parallelepiped shape. In an embodiment, the mask MK may have two sides extending in a first direction DR1 and two sides extending in a second direction DR2, for example. The second direction DR2 indicates a direction crossing the first direction DR1.

The mask MK may be a thin plate having a small thickness in a third direction DR3. The third direction DR3 indicates a direction substantially perpendicularly crossing the plane defined by the first direction DR1 and the second direction DR2.

In a plan view, the mask MK may have a quadrangular (e.g., rectangular) shape. In this specification, the wording "in a plan view" means a state of viewing an element from the top.

The mask MK may include a mask frame MF and a plurality of cell masks CMK. In an embodiment, the mask frame MF and the cell masks CMK may include a metallic material such as stainless steel ("SUS"), an invar alloy, nickel (Ni), or cobalt (Co), for example. However, the materials for the mask frame MF and the cell masks CMK are not limited thereto.

The mask frame MF may have a quadrangular (e.g., rectangular) shape having two sides extending in the first direction DR1 and two sides extending in the second direction DR2.

A plurality of cell openings COP may be defined in the mask frame MF. The cell openings COP may be arranged in the first direction DR1 and the second direction DR2.

In a plan view, the cell openings COP may each have a quadrangular (e.g., rectangular) shape. With respect to the third direction DR3, the cell openings COP may be defined as passing through the mask frame MF.

FIG. 1 illustrates four cell openings COP, but the invention is not limited thereto, and the number of the cell openings COP may actually be more than four. In addition, the shape of each of the cell openings COP may be deformed according to the shape of the cell mask CMK.

Edge parts LP may each be defined as a portion of the mask frame MF surrounding each of the cell openings COP. In a plan view, the edge parts LP may each have a rectangular annular shape.

The cell masks CMK may each overlap the corresponding cell opening COP in a plan view. In an embodiment, in a plan view, the cell masks CMK may each have a rectangular shape, for example.

A plurality of deposition holes H may be defined in each of the cell masks CMK. The deposition holes H may be defined as passing through the cell masks CMK in the third direction DR3. The width of each deposition hole H along the first direction DR1 or the second direction DR2 is changeable. In an embodiment, with respect to the third direction DR3, the width of an upper portion of each deposition hole H may be greater than the width of a lower portion of each deposition hole H, for example. However, the shapes of the deposition holes H are not limited thereto.

The cell masks CMK may be disposed on the mask frame MF. In a plan view, the edge part of each cell mask CMK may overlap the edge part LP of the mask frame MF.

The cell masks CMK may be fixed to the mask frame MF. In an embodiment, the cell masks CMK may be fixed to the mask frame MF by an intense light (e.g., laser beam), for example. This will be described in detail later.

Figure 2:
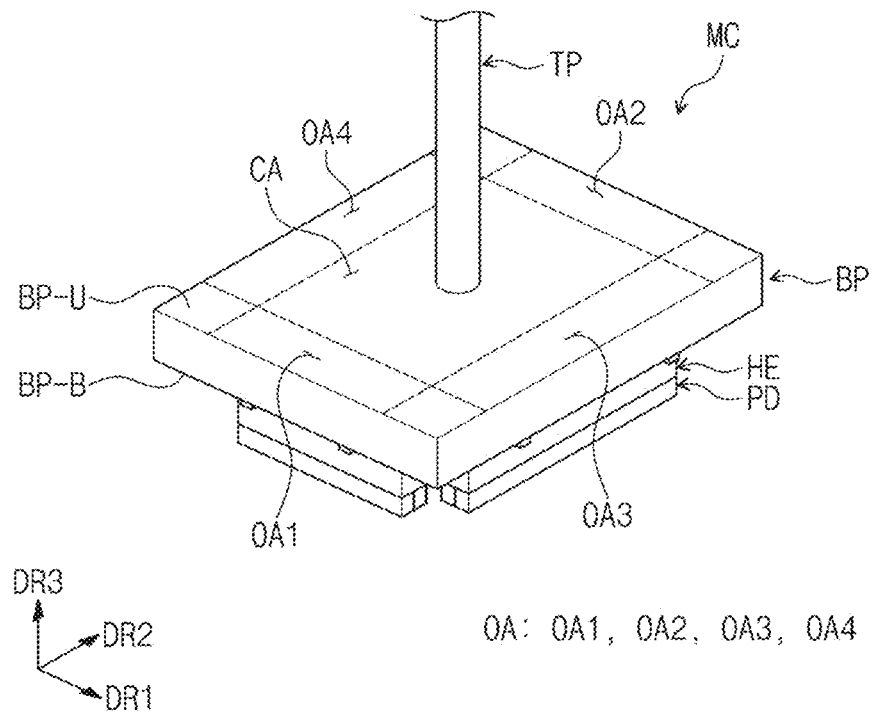
FIG. 2 is a perspective view illustrating an embodiment of a mask chuck according to the invention.
Figure 3:
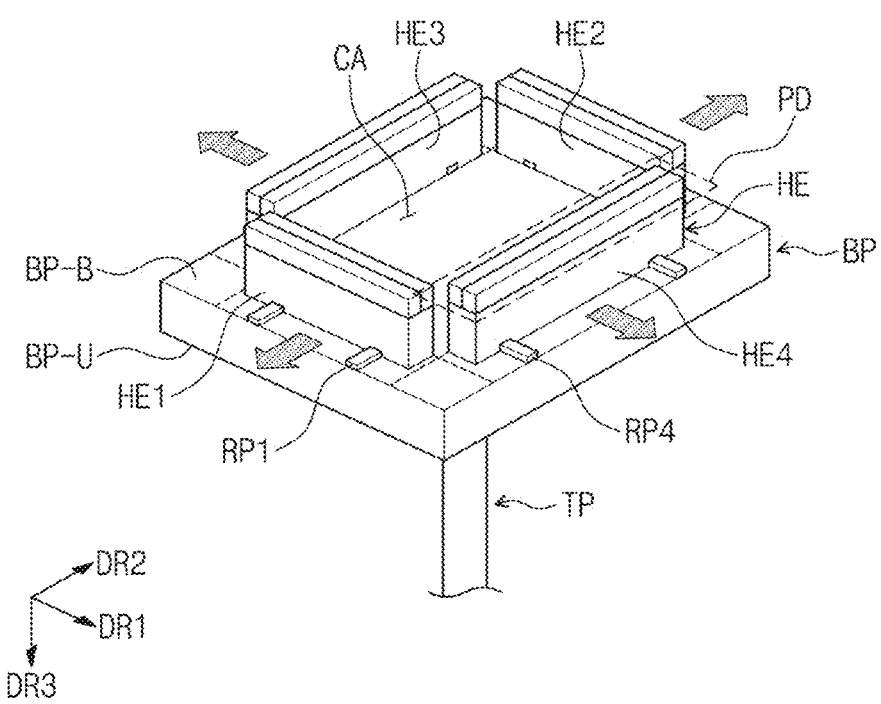
FIG. 3 is a perspective view vertically inverting and illustrating a mask chuck illustrated in FIG. 2.

FIG. 2 is a perspective view illustrating an embodiment of a mask chuck according to the invention. FIG. 3 is a perspective view vertically inverting and illustrating the mask chuck illustrated in FIG. 2. FIG. 3 is a view for describing a lower structure of the mask chuck MC illustrated in FIG. 2. Substantially, FIG. 3 illustrates the shape of the mask chuck MC "when viewed from under a pad part PD".

Referring to FIGS. 2 and 3, the mask chuck MC may be used to manufacture the mask MK illustrated in FIG. 1. The mask chuck MC may stretch the cell mask CMK illustrated in FIG. 1 and dispose the stretched cell mask CMK to the mask frame MF.

In an embodiment of the invention, the mask chuck MC may include a base plate BP, a head part HE disposed under the base plate BP, a pad part PD disposed under the head part HE, and a transfer part TP disposed on the base plate BP.

The base plate BP may have a quadrangular (e.g., rectangular) shape in a plan view. The base plate BP may include an upper surface BP-U and a lower surface BP-B. The upper surface BP-U and the lower surface BP-B of the base plate BP may each be parallel to the plane defined by the first direction DR1 and the second direction DR2.

The base plate BP may include a central region CA and an edge region OA disposed around the central region CA. The central region CA may have a quadrangular (e.g., rectangular) shape in a plan view.

The edge region OA may surround the central region CA. Specifically, the edge region OA may include a first edge region OA1, a second edge region OA2, a third edge region OA3, and a fourth edge region OA4.

The first edge region OA1 and the second edge region OA2 may extend in the first direction DR1. The second edge region OA2 may be spaced apart from the first edge region OA1 in the second direction DR2. The central region CA may be disposed between the first edge region OA1 and the second edge region OA2.

A third edge region OA3 and a fourth edge region OA4 may extend in the second direction DR2. The fourth edge region OA4 may be spaced apart from the third edge region OA3 in the first direction DR1. The central region CA may be disposed between the third edge region OA3 and the fourth edge region OA4.

In an embodiment of the invention, an upper surface of the head part HE may be disposed on the lower surface BP-B of the base plate BP. The head part HE may overlap the edge region OA. Specifically, the head part HE may include a first head part HE1, a second head part HE2, a third head part HE3, and a fourth head part HE4.

The first to fourth head parts HE1 to HE4 may be disposed on the lower surface BP-B of the base plate BP. The first to fourth head parts HE1 to HE4 may be separated from each other.

The first head part HE1 may overlap the first edge region OA1. The second head part HE2 may overlap the second edge region OA2. The first head part HE1 and the second head part HE2 may each extend in the first direction DR1. In an embodiment, the first head part HE1 and the second head part HE2 may each have a quadrangular (e.g., rectangular) parallelepiped shape lengthily extending in the first direction DR1, for example.

The third head part HE3 may overlap the third edge region OA3. The fourth head part HE4 may overlap the fourth edge region OA4. The third head part HE3 and the fourth head part HE4 may each extend in the second direction DR2. In an embodiment, the third head part HE1 and the fourth head part HE2 may have a quadrangular (e.g., rectangular) parallelepiped shape lengthily extending in the second direction DR2, for example.

In an embodiment of the invention, the head part HE may move so as to be close to the central region CA or away from the central region CA in the edge region OA. In an embodiment, a rail part may be disposed between the head part HE and the base plate BP, for example.

Specifically, a first rail part RP1 may be disposed on the lower surface BP-B overlapping the first edge region OA1. The first rail part RP1 may extend in the second direction DR2. A fourth rail part RP4 may be disposed on the lower surface BP-B overlapping the fourth edge region OA4 and extend in the first direction DR1.

Although not shown due to an observation position of FIG. 3, a second rail part may be disposed on the lower surface BP-B overlapping the second edge region OA2. The second rail part may extend in the second direction DR2. A third rail part may be disposed on the lower surface BP-B overlapping the third edge region OA3 and extend in the first direction DR1.

The first to fourth head parts HE1 to HE4 may each move so as to be closer to the central region CA on the corresponding rail part or to be farther from the central region CA. Specifically, the first head part HE1 and the second head part HE2 may move in the second direction DR2 and the third head part HE3 and the fourth head part HE4 may move in the first direction DR1. The first to fourth head parts HE1 to HE4 may move simultaneously or independently.

However, the movement method of the head part HE is not limited to those described above. In an embodiment, a method may be used in which a recess is defined in the lower surface BP-B of the base plate BP, and the head part HE moves while a portion of the head part HE is inserted in the recess, for example.

Figure 4:
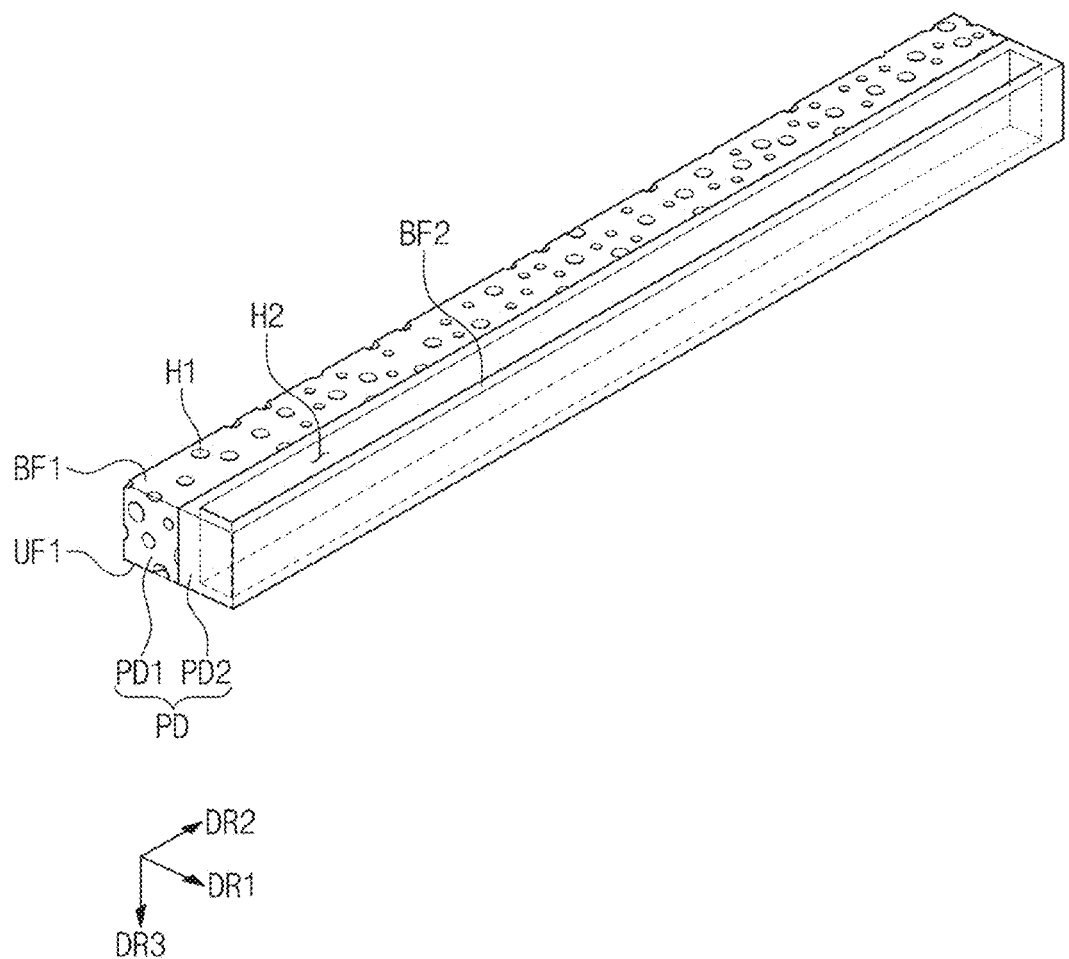
FIG. 4 is a perspective view illustrating an embodiment of a pad part disposed on a lower surface of a fourth head part among the pad parts illustrated in FIG. 3.

FIG. 4 is a perspective view illustrating an embodiment of a pad part disposed on a lower surface of a fourth head part among the pad parts illustrated in FIG. 3. For convenience of description, in FIG. 4, the pad part PD illustrated in FIG. 2 is illustrated in a vertically inverted shape.

Referring to FIGS. 3 and 4, the pad part PD may be disposed on the head part HE. Specifically, the pad part PD may be disposed on the lower surface of the head part HE.

A plurality of pad parts PD may be provided. In an embodiment, the pad part PD may be disposed under each of the first to fourth head parts HE1 and HE4, for example.

The pad part PD may extend in the extension direction of the corresponding head parts HE1 to HE4. In an embodiment, the pad part PD disposed under the lower surface of each of the first head part HE1 and the second head part HE2 may extend in the first direction DR1, for example. The pad part PD disposed on the lower surface of each of the third head part HE3 and the fourth head part HE4 may each extend in the second direction DR2.

The pad part PD may include a first pad PD1 and a second pad PD2 disposed adjacent to the first pad PD1. The first pad PD1 and the second pad PD2 may be disposed in parallel in the lengthwise direction thereof. In an embodiment, referring to FIGS. 3 and 4, the first pad PD1 and the second pad PD2 which are disposed on the lower surface of the fourth head part HE4 may each extend in the second direction DR2 and be disposed parallel to the second direction DR2, for example.

In an embodiment of the invention, the first pad PD1 may be disposed more adjacent to the central region CA than the second pad PD2 is to the central region CA. In other words, the first pad PD1 may be disposed on the inner side on the lower surface of the head part HE, and the second pad PD2 may be disposed on the outer side on the lower surface of the head part HE.

In an embodiment of the invention, the first pad PD1 may have a porous structure. In an embodiment, a plurality of first holes H1 may be defined in the first pad PD1, for example. The first holes H1 may be irregularly defined in the surface of the first pad PD1. The first holes H1 may be defined on all of the first lower surface BF1, side surfaces, and the first upper surface UF1 of the first pad PD1.

The first lower surface BF1 and the first upper surface UF1 of the first pad PD1 may communicate with each other by the first holes H1. The first upper surface UF1 refers to a surface facing the lower surface of the head part (for example, the fourth head part HE4 illustrated in FIG. 3)

corresponding to the first pad PD1. The air flowing into the first lower surface BF1 of the first pad PD1 may flow out of the first upper surface UF1.

In an embodiment of the incentive concept, a second hole H2 may be defined in the second pad PD2. When viewed from under the pad part PD, the area of the second hole H2 may be greater than the area of each of the first holes H1. In an embodiment, the second hole H2 may be defined as a line shape, for example.

In an embodiment, as illustrated in FIG. 4, in the case of the second pad PD2 disposed on the fourth pad head part HE4, the second hole H2 may extend lengthily in the second direction DR2, for example.

The second hole H2 may pass through the second pad PD2 in the thickness direction (for example, the third direction DR3). The upper portion and the lower portion of the second pad PD2 may communicate with each other by the second hole H2. The upper portion refers to a portion adjacent to the head part HE in the second pad PD2, and the lower portion refers to a portion opposite to the upper portion in the second pad PD2.

In an embodiment of the invention, the head part HE may include a pneumatic control part (not shown). The pneumatic control part may be disposed inside the head part HE. The pneumatic control part may be connected to the first upper surface UF1 of the first pad PD1 and the upper portion of the second pad PD2. The pneumatic control part may suction air. In an embodiment, the pneumatic control part may include one or more flow paths and a blower, for example.

The pneumatic control part may form a negative pressure on the lower surface BF1 of the first pad PD1 and in a lower portion of the second pad PD2. Accordingly, the air in the surrounding of the lower surface BF1 of the first pad PD1 and the lower portion of the second pad PD2 may be suctioned and flow into the head part HE through the first pad PD1 and the second pad PD2.

In an embodiment of the invention, the first lower surface BF1 of the first pad PD1 and the second lower surface BF2 of the second pad PD2 may be disposed coplanar with each other. The first lower surface BF1 of the first pad PD1 and the second lower surface BF2 of the second pad PD2 may contact a target object.

The area of the second hole H2 may be greater than the sum of the first holes H1 defined in the first lower surface BF1. Accordingly, when the pneumatic control part operates, the suction force generated in the lower portion of the second pad PD2 may be greater than the suction force generated in the first lower surface BF1 of the first pad PD1. In other words, the force acting between the second pad PD2 and the target object may be greater than the force acting between the first pad PD1 and the target object.

Referring back to FIG. 2, the mask chuck MC may further include a transfer part TP. The transfer part TP may be connected to the upper surface BP-U of the base plate BP and may move the base plate BP. The transfer part TP may move the base plate BP in the first to third directions DR1 to DR3.

Figure 5A:
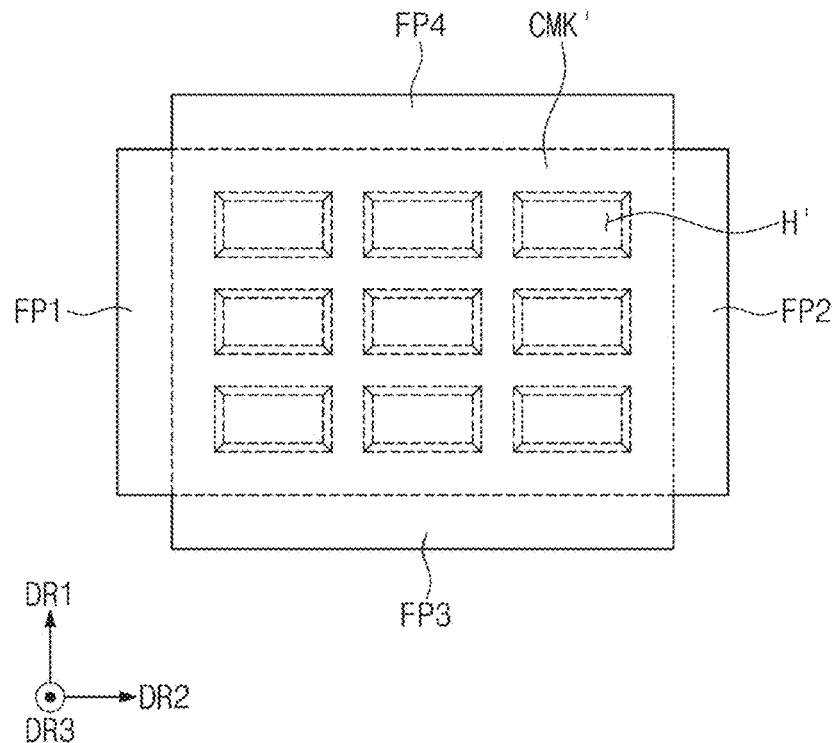
FIG. 5A is a view illustrating a state before the cell mask illustrated in FIG. 1 is stretched.
Figure 5B:
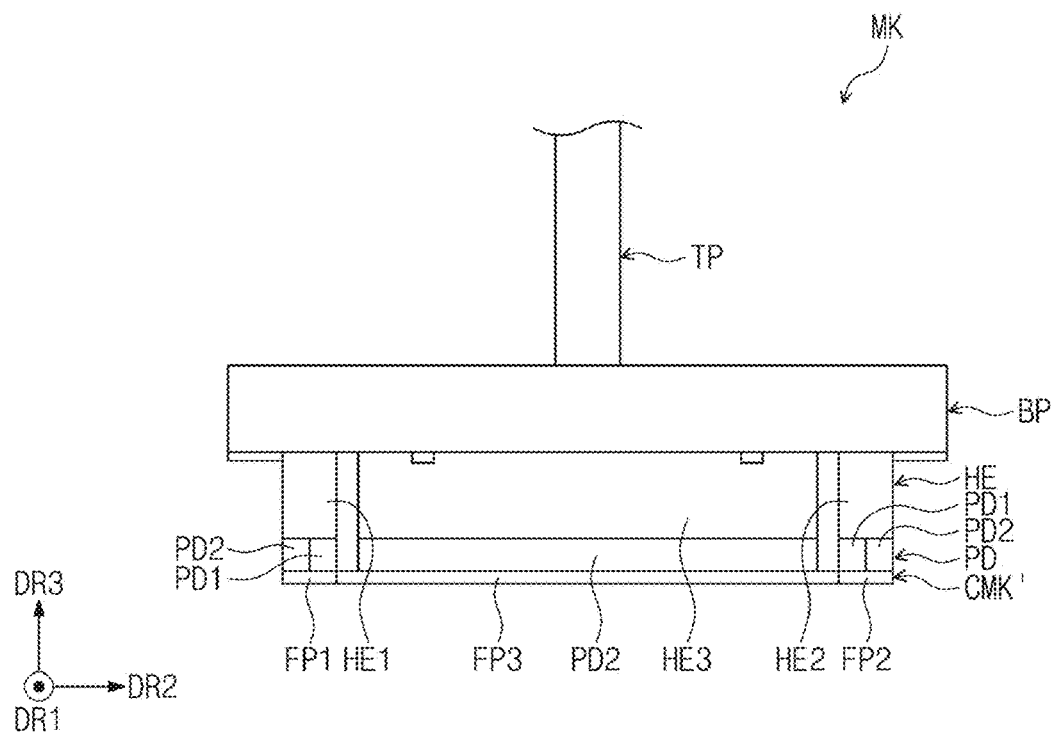
FIG. 5B is a view illustrating a state in which the mask chuck illustrated in FIG. 2 picks the cell mask illustrated in FIG. 5A.

FIG. 5A is a view illustrating a state before the cell mask illustrated in FIG. 1 is stretched. FIG. 5B is a view illustrating a state in which the mask chuck illustrated in FIG. 2 picks the cell mask illustrated in FIG. 5A.

Referring to FIG. 5A, the cell mask CMK may be in a state before the cell mask CMK illustrated in FIG. 1 is stretched. A plurality of deposition holes H' may be defined in the cell mask CMK'. In a plan view, the area of the cell mask CMK' may be smaller than the area of the cell mask CMK illustrated in FIG. 1. In a plan view, the area of the deposition hole H' may be smaller than the area of the deposition hole H illustrated in FIG. 1.

Wing parts may be disposed on the periphery of the cell mask CMK'. In an embodiment, the wing parts may each extend from the periphery of the cell mask CMK', for example. Specifically, a first wing part FP1 and a second wing part FP2 may extend from the cell mask CMK' in the second direction DR2. A third wing part FP3 and a fourth wing part FP4 may each extend from the cell mask CMK' in the first direction DR1.

The first to fourth wing parts FP1 to FP4 may be unitary with the cell mask CMK'. In an embodiment, the first to fourth wing parts FP1 to FP4 may include a metallic material, for example. The first to fourth wing parts FP1 to FP4 may be removed from the process to be described later.

Referring to FIGS. 5A and 5B, the mask chuck MC may pick the cell mask CMK'. In an embodiment, the transfer part TP may dispose the base plate BP on the cell mask CMK', for example. The transfer part TP may lower the base plate BP and bring the pad part PD into contact with the cell mask CMK'.

In a plan view, the first head part HE1 of the mask chuck MC may overlap the first wing part FP1. The pad part PD disposed on the lower surface of the first head part HE1 may contact the upper surface of the first wing part FP1. Specifically, the first pad PD1 may contact an inner portion adjacent to the cell mask CMK' on the upper surface of the first wing part FP1, and the second pad PD2 may contact the outer portion of the upper surface of the first wing part FP1.

The second head part HE2 of the mask chuck MC may overlap the second wing part FP2. The pad part PD disposed on the lower surface of the second head part HE2 may contact the upper surface of the second wing part FP2. The third head part HE3 may overlap the third wing part FP3, and the pad part PD disposed on the lower surface of the third head part HE3 may contact the upper surface of the third wing part FP3. Although not shown, the pad part PD disposed on the lower surface of the fourth head part HE4 may contact the upper surface of the fourth wing part FP4.

The cell masks CMK' may be fixed onto the mask chuck MC. In an embodiment, when the pneumatic control part of the head part HE operates, the wing parts FP1 to FP4 may be suctioned and attached to the pad parts PD, for example. As described above, the suction force between the second pad PD2 and the wing parts FP1 to FP4 may be greater than the suction force between the first pad PD1 and the wing parts FP1 to FP4.

Figure 6A:
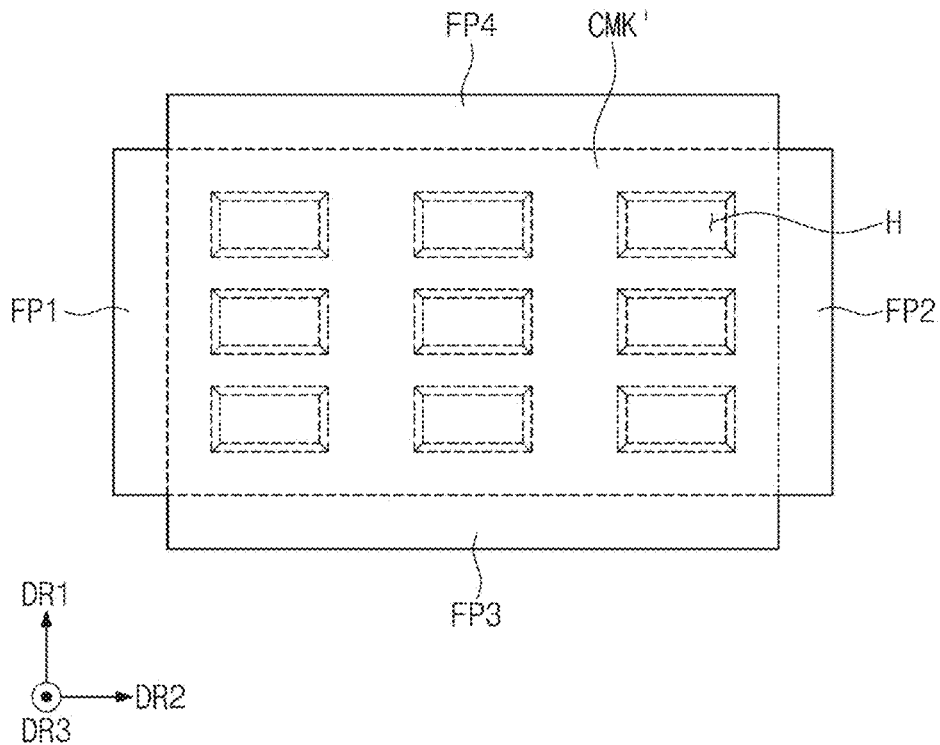
FIG. 6A is a view illustrating a state in which the mask chuck illustrated in FIG. 5B stretches a cell mask.
Figure 6B:
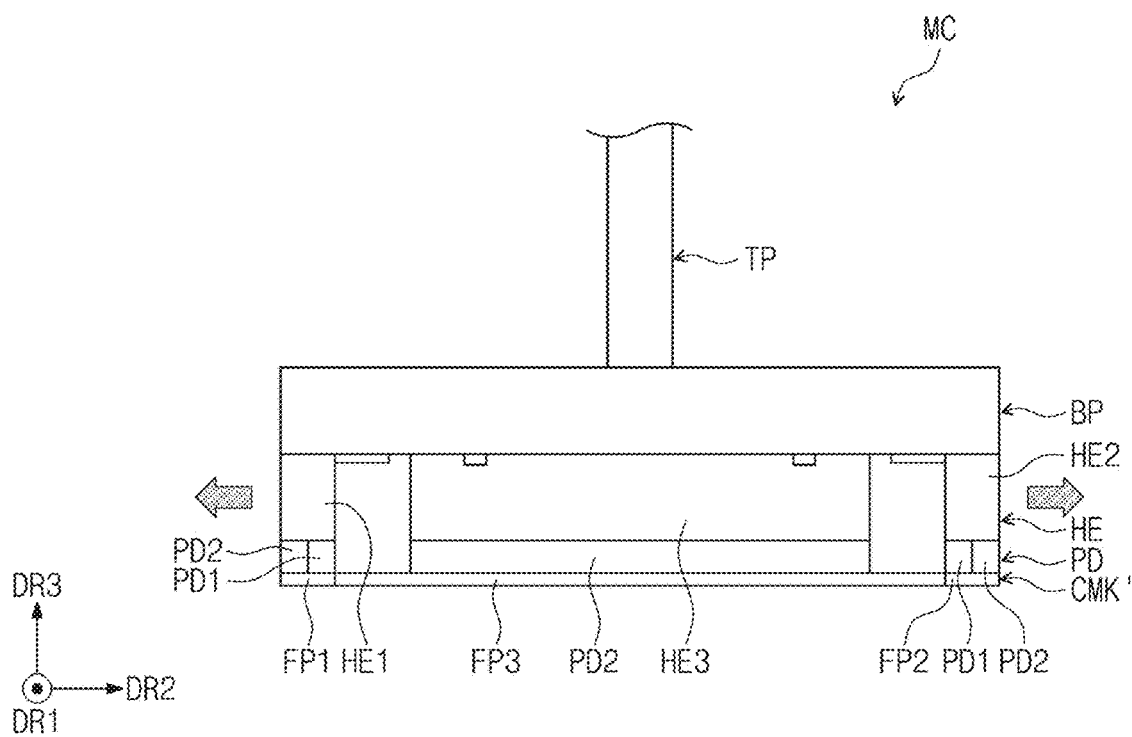
FIG. 6B is a view illustrating a state in which the cell mask illustrated in FIG. 5A is stretched.

FIG. 6A is a view illustrating a state in which the mask chuck illustrated in FIG. 5B stretches a cell mask. FIG. 6B is a view illustrating a state in which the cell mask illustrated in FIG. 5A is stretched.

Referring to FIG. 6A, the mask chuck MC may stretch the cell mask CMK'. Specifically, in a state in which the wing parts FP1 to FP4 are fixed to the pad part PD, the mask chuck MC may move the head part HE in a direction from the inside toward the outside.

Specifically, with respect to FIG. 6A, the first head part HE1 may move in the leftward direction and the second head part HE2 may move in the rightward direction. Accordingly, the cell mask CMK' may be stretched in the second direction DR2. Furthermore, the third head part HE3 may move in a direction piercing out of FIG. 6A. The fourth head part HE4 may move in a direction piercing into FIG. 6A. Accordingly, the cell mask CMK' may be stretched in the first direction DR2. The directions in which the first to fourth head parts HE1 to HE4 are illustrated in detail in FIG. 3.

Referring to FIG. 6B, the cell mask CMK' may mean a state in which the cell mask CMK' illustrated in FIG. 5A is stretched. Specifically, in a plan view, the area of a stretched cell mask CMK' may be greater than the area of the cell mask CMK' of FIG. 5A. The area of the stretched cell mask CMK' excluding the wing parts FP1 to FP4 may be equal to the cell mask CMK illustrated in FIG. 1. The area of the deposition hole H may be equal to the area of the deposition hole H illustrated in FIG. 1.

Figure 7:
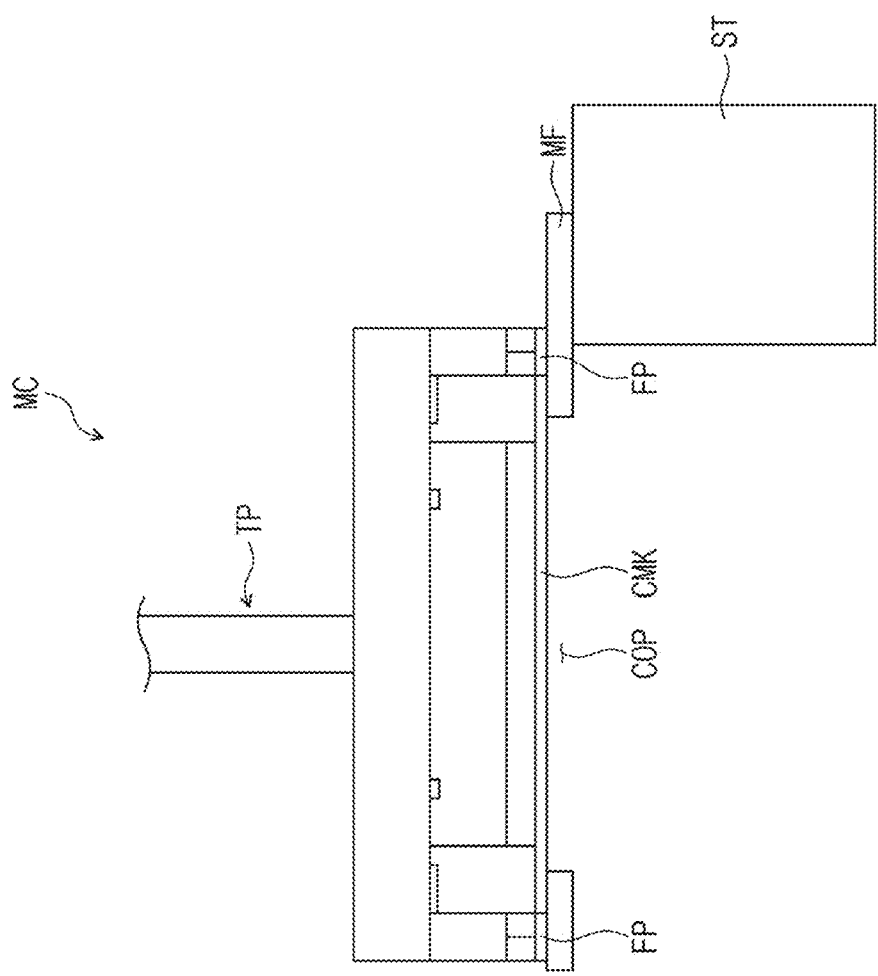
FIG. 7 is a view illustrating a state in which the mask chuck illustrated in FIG. 6A disposes a cell mask on a mask frame.
Figure 8:
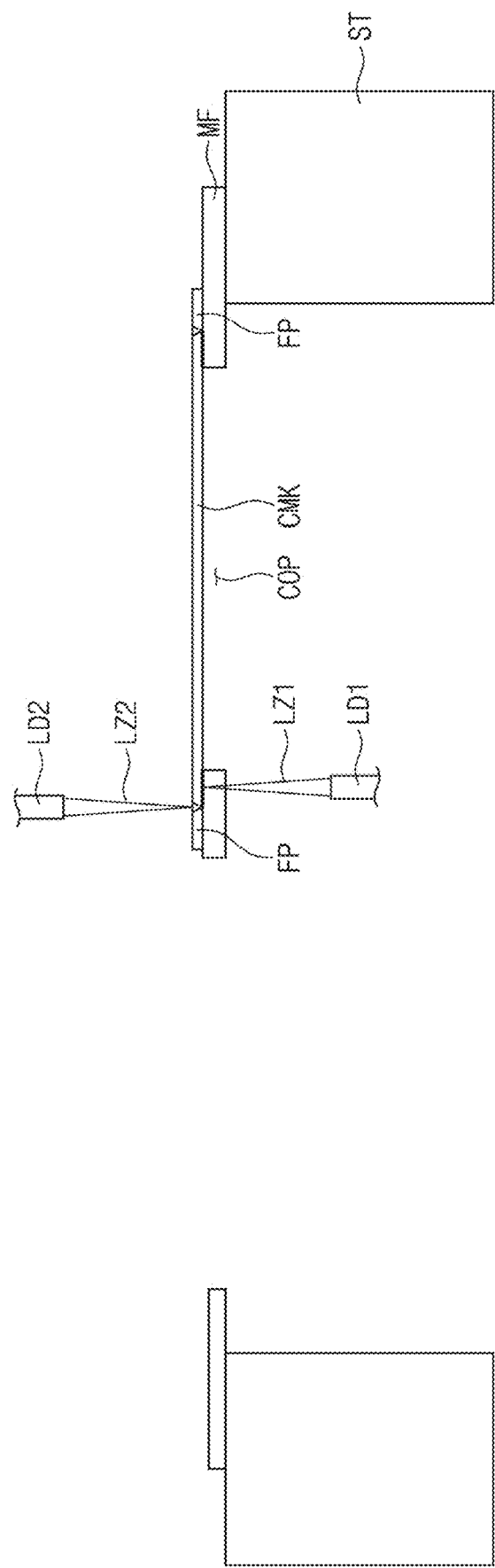
FIG. 8 is a view exemplarily illustrating a state in which the cell mask illustrated in FIG. 7 is fixed to a mask frame.

FIG. 7 is a view illustrating a state in which the mask chuck illustrated in FIG. 6A disposes a cell mask on a mask frame. FIG. 8 is a view illustrating a state in which the cell mask illustrated in FIG. 7 is fixed to a mask frame.

Referring to FIG. 7, a mask chuck MC may dispose a stretched cell mask CMK on a mask frame MF disposed on a stage ST. The disposition of the cell mask CMK may be performed by a transfer part TP.

The edge part of the cell mask CMK and a wing part FP may contact the upper surface of the mask frame MF.

Referring to FIG. 8, an intense-light emitting apparatus (e.g., laser apparatus) LD1 may irradiate a first laser beam LZ1 on a contact surface between the edge part of the cell mask CMK and the upper surface of the mask frame MF making contact with the edge part. In an embodiment, the first laser apparatus LD1 may be disposed under the mask frame MF and emit the first laser beam LZ1 in an upward direction, for example.

A portion of the cell mask CMK adjacent to the contact surface or a portion of the mask frame MF may be melted by the first laser beam LZ1. The cell mask CMK may be fixed to the mask frame MF while portions melted by the first laser bean LZ1 are cooled.

A second laser apparatus LD2 may remove the wing parts FP from the cell mask CMK. In an embodiment, the second laser apparatus LD2 may be disposed above the cell mask CMK, and emit a second laser beam LZ2 in a downward direction, for example. The second laser beam LZ2 may be emitted to a boundary between the cell mask CMK and the wing parts FP. The second laser beam LZ2 may cut a boundary portion between the cell mask CMK and the wing parts FP.

Consequently, the cell mask CMK may be fixed to the mask frame MF by the above-described processes as illustrated in FIG. 1.

The mask chuck MC in an embodiment of the invention may perform not only the function for disposing the cell mask CMK on the mask frame MF, but also the stretching process. Accordingly, the mask manufacturing process may be simplified and the yield thereof may be improved.

In an embodiment of the invention, when the mask chuck MC contacts the wing part FP of the cell mask CMK and stretches the cell mask CMK, the first pad PD1 having relatively small suction force may be disposed adjacent to the cell mask CMK and the second pad PD2 having relatively great suction force may be separated from the cell mask CMK, and therefore the deformation of the cell mask CMK may be minimized.

In an embodiment of the invention, a surface treatment process may be performed on the upper surfaces of the wing parts FP. The surface treatment process may improve the suction force between the wing part FP and the pad part PD by decreasing the surface roughness of the upper surfaces of the wing parts FP. Accordingly, when the cell mask CMK is stretched, a slip phenomenon occurring between the wing part FP and the pad part PD may be improved.

Hereinafter, the mask chucks according to other embodiments of the invention will be described. The mask chucks below in embodiments may have the same configuration as the mask chuck MC according to the above-described embodiments excluding the configurations (for example, pad driving part and magnet part) disposed on the pad part and inside the pad part. Hereinafter, descriptions on the same configuration will be omitted and the configuration different from the above-described embodiments will be described in detail.

Figure 9:
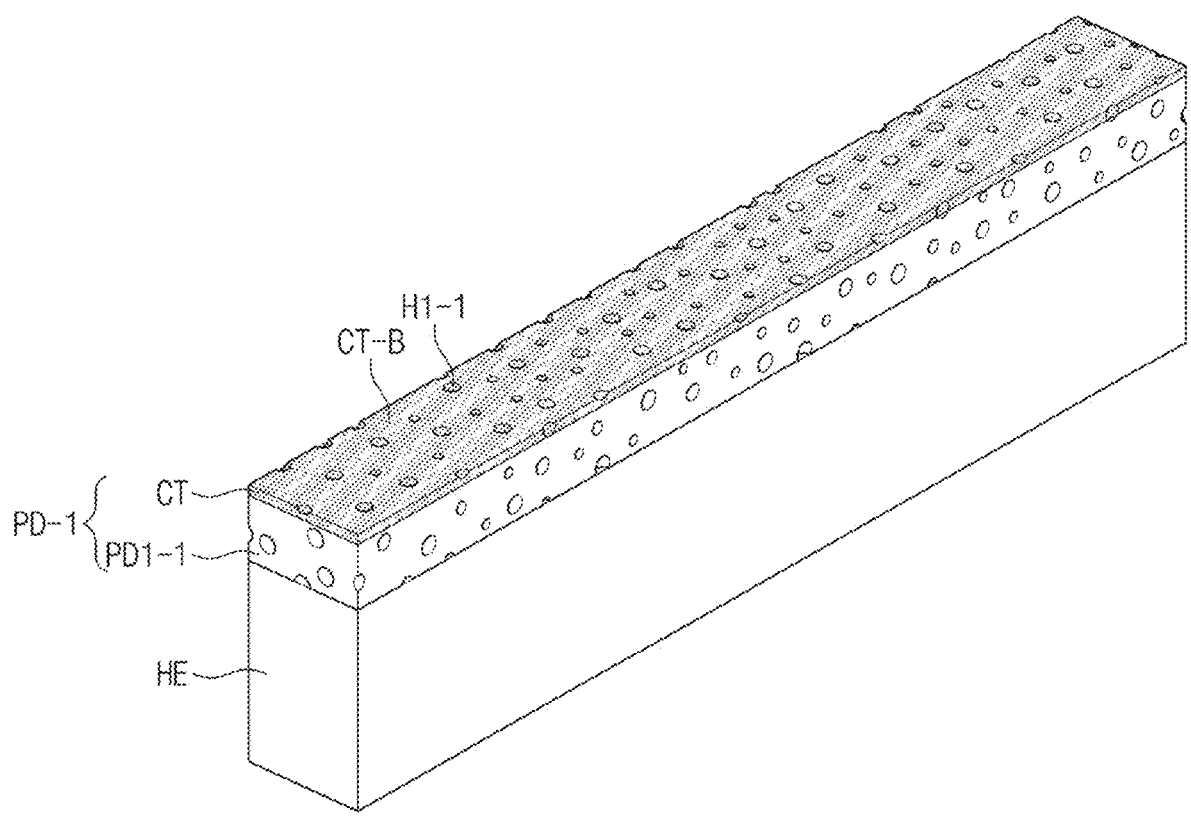
FIG. 9 is a view illustrating an embodiment of a pad part of a mask chuck according to the invention.

FIG. 9 is a view illustrating an embodiment of a pad part of a mask chuck according to the invention. For convenience of description, in FIG. 9, a pad part PD-1 and a head part HE is vertically inverted and illustrated.

Referring to FIG. 9, the pad part PD-1 may be disposed on a lower surface of the head part HE and extend in the lengthwise direction of the head part HE. The pad part PD-1 may include a first pad PD1-1 and a coating layer CT. The first pad PD1-1 may be disposed on the lower surface of the head part HE. The first pad PD1-1 may have substantially the same structure as the first pad PD1 illustrated in FIG. 4.

In an embodiment, a plurality of first holes H1-1 may be defined in the first pad PD1-1, for example. The first holes H1-1 may be irregularly arranged in the surface of the first pad PD1-1.

The coating layer CT may be disposed on the lower surface of the first pad PD1-1. The coating layer CT may substantially be provided by coating the lower surface of the first pad PD1-1 with a predetermined material. The coating layer CT may not overlap the first holes H1-1.

The lower surface CT-B of the coating layer CT may have a greater friction coefficient than that of the lower surface of the first pad PD1-1.

In an embodiment of the invention, the coating layer CT including a material having a large friction coefficient than that of the first pad PD1-1 is further disposed on the lower surface of the pad part PD1, and thus, when the mask chuck performs a stretching process, the problem of causing a slip phenomenon between the cell mask CMK and the pad part PD-1 may be solved.

Figure 10A:
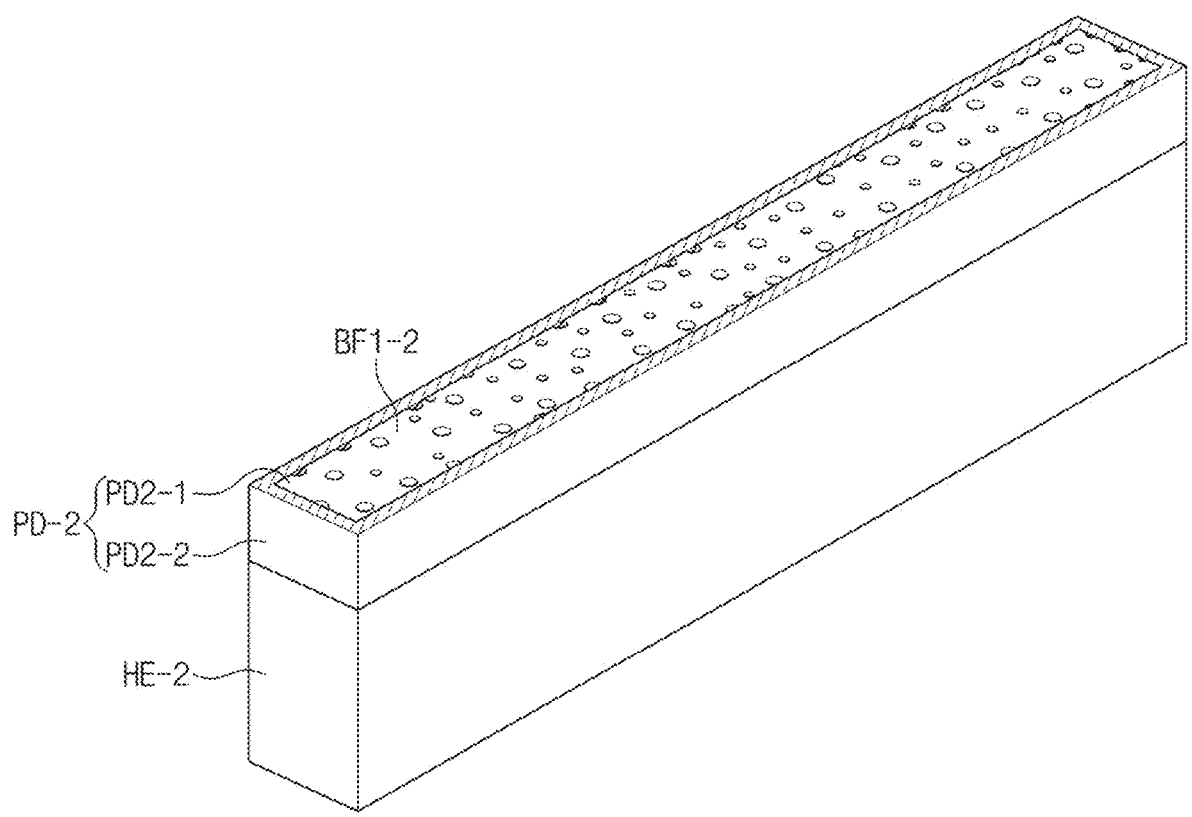
FIGS. 10A and 10B are views illustrating an embodiment of a pad part of a mask chuck according to the invention.
Figure 10B:
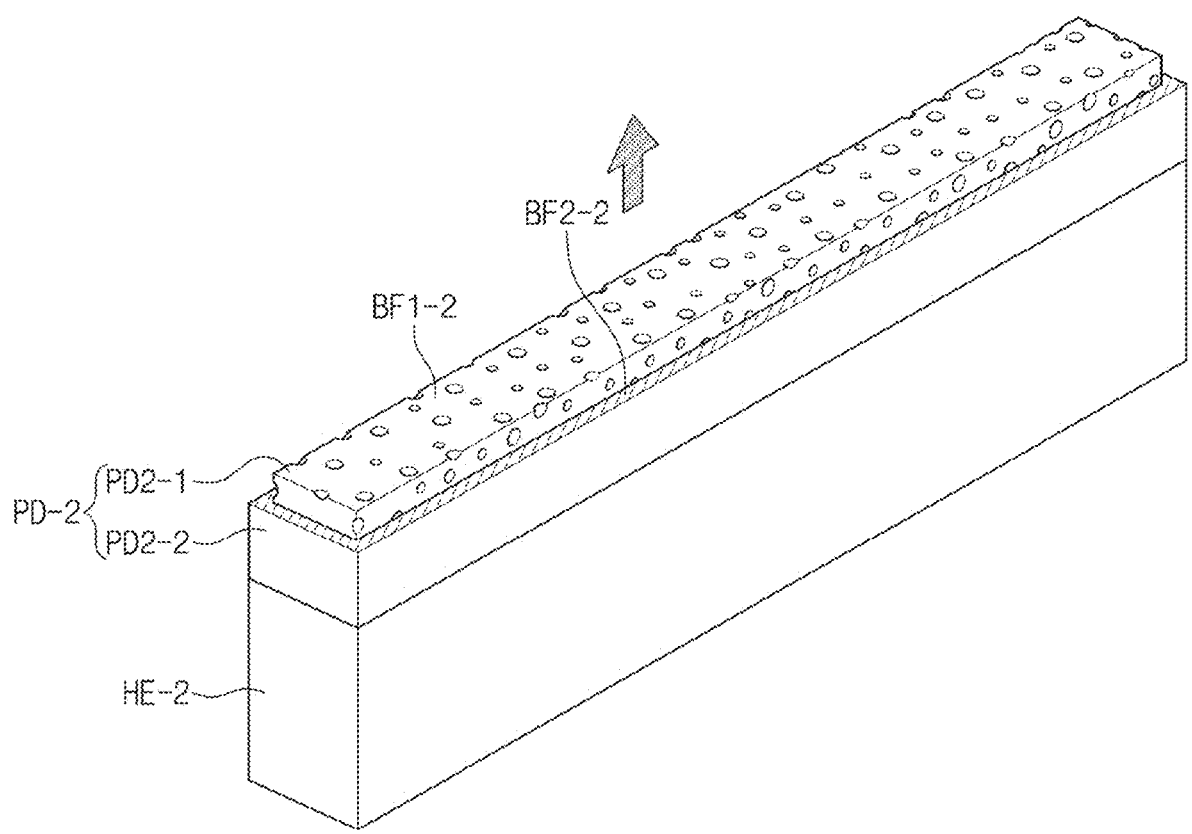

FIGS. 10A and 10B are views illustrating a pad part of a mask chuck according to the invention. For convenience of description, in FIGS. 10A and 10B, a pad part PD-2 and a head part HE-2 are vertically inverted and illustrated.

Referring to FIG. 10A, a pad part PD-2 may include a first pad PD2-1 and a second pad PD2-2. The first pad PD2-1 may extend in the lengthwise direction (for example, the second direction DR2) of the head part HE-2. The first pad PD2-1 may be disposed on a central portion of the lower surface of the head part HE-2. When viewed from under the pad part PD-2, the first pad PD2-1 may have a quadrangular (e.g., rectangular) shape extending lengthily in the second direction DR2.

The first pad PD2-1 may have substantially the same structure as the first pad PD1 illustrated in FIG. 4. In an embodiment, a plurality of first holes H1-2 may be defined in the surface of the first pad PD2-1, for example. The first pad PD 1-2 may be connected to a pneumatic control part disposed inside the head part HE-2.

The second pad PD2-2 may surround the first pad PD2-1. In an embodiment, from under the pad part PD-2, the second pad PD2-2 may be disposed extending along the periphery of the first pad PD2-1, for example. In an embodiment, the second pad PD2-2 may have a quadrangular (e.g., rectangular) annular shape, for example.

A first lower surface BF1-2 of the first pad PD2-1 may have a first friction coefficient. A second lower surface BF2-2 of the second pad PD2-2 may have a second friction coefficient. In this embodiment, the second friction coefficient may be greater than that of the first friction coefficient.

Referring to FIG. 10B, the position of the first pad PD2-1 may vary. In an embodiment, the first pad PD2-1 may be connected to a pad driving part. The pad driving part may be disposed inside the head part HE-2, for example. The pad derive part may be connected to a first upper surface of the first pad PD2-1. The first upper surface may be a surface opposite the first lower surface BF1-2 in the third direction DR3. The pad driving part may move the first pad PD2-1 in a direction (for example, the third direction DR3) perpendicular to the first lower surface BF1-2.

Figure 11A:
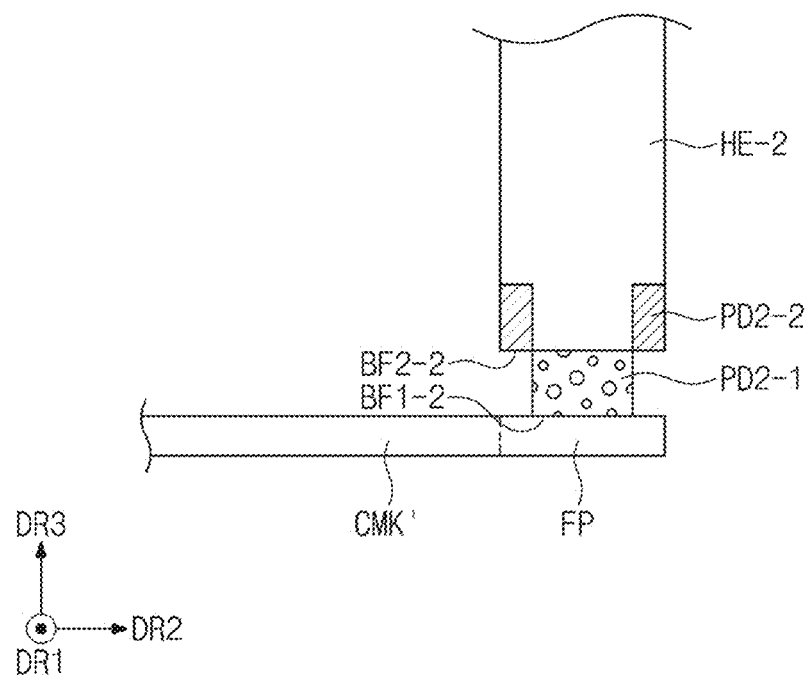
FIGS. 11A and 11B are views illustrating a state in which a mask chuck including a pad part and a head part which are illustrated in FIGS. 10A and 10B stretches a cell mask.
Figure 11B:
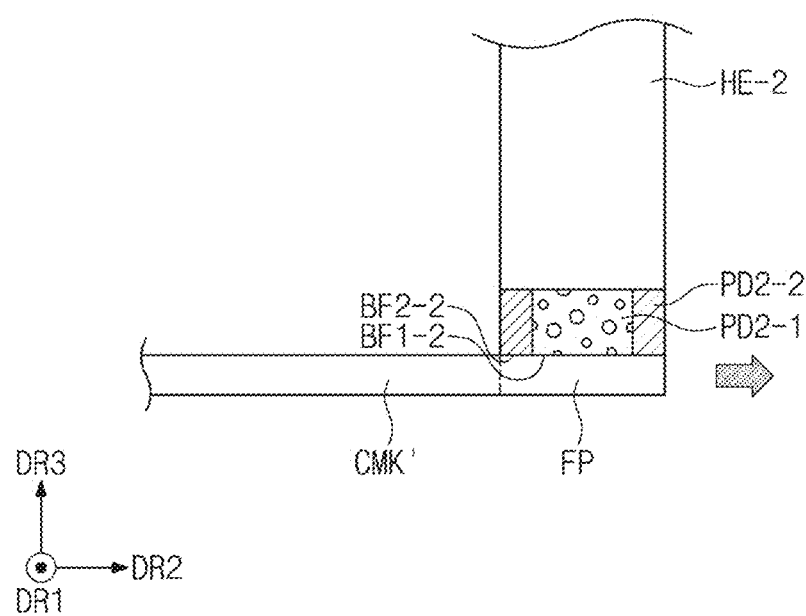

FIGS. 11A and 11B are views illustrating a state in which a mask chuck including the pad part and the head part which are illustrated in FIGS. 10A and 10B stretches a cell mask.

Referring to FIG. 11A, a first lower surface BF1-2 of a first pad PD2-1 protrudes further downward (for example, in the third direction DR3) than a second lower surface BF2-2 of a second pad PD2-2. The first lower surface BF1-2 of the first pad PD2-1 may first contact a wing part FP. The wing part FP may be any one among the wing parts FP1 to FP4 illustrated in FIG. 5A.

While the first pad PD2-1 is in contact with the wing part FP, the pneumatic control part may fix the wing part FP to the first pad PD2-1.

Referring to FIG. 11B, the second lower surface BF2-2 of the second pad PD2-2 may contact the wing part FP. The second pad PD2-2 may contact the wing part FP as the pad driving part moves the position of the first pad PD2-1 in the third direction DR3. While the first pad PD2-1 and the second pad PD2-2 are in contact with the wing part FP, the head part HE-2 may move outward (rightward direction with respect to FIG. 11B). Accordingly, the cell mask CMK' may be stretched.

In an embodiment of the invention, while the wing part FP is fixed to the first pad PD2-1 by vacuum suction force, the second pad PD2-2 having a greater friction coefficient than that of the first pad PD2-1 may contact the wing part FP. Accordingly, when extending the cell mask CMK', a slip phenomenon between the wing part FP and the pad part PD-2 is improved and a stretching process with high completeness may be performed.

Figure 12A:
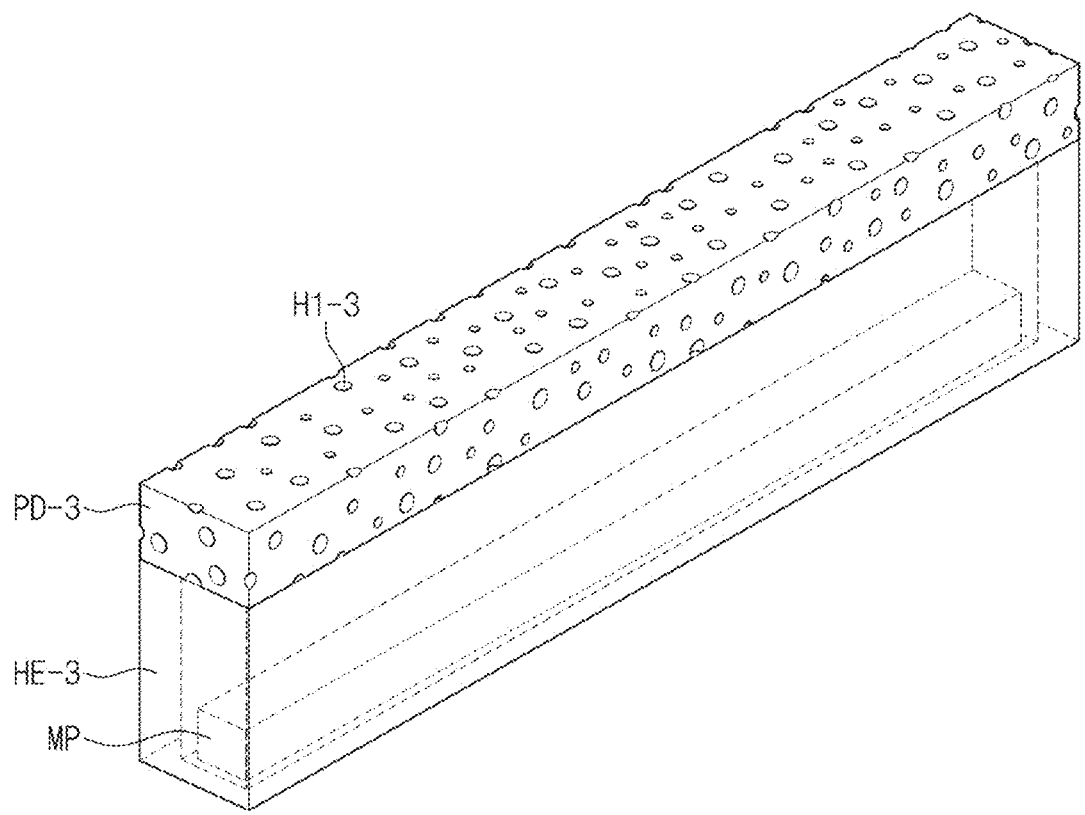
FIGS. 12A and 12B are views illustrating an embodiment of a pad part and a magnet part of a mask chuck according to the invention.
Figure 12B:
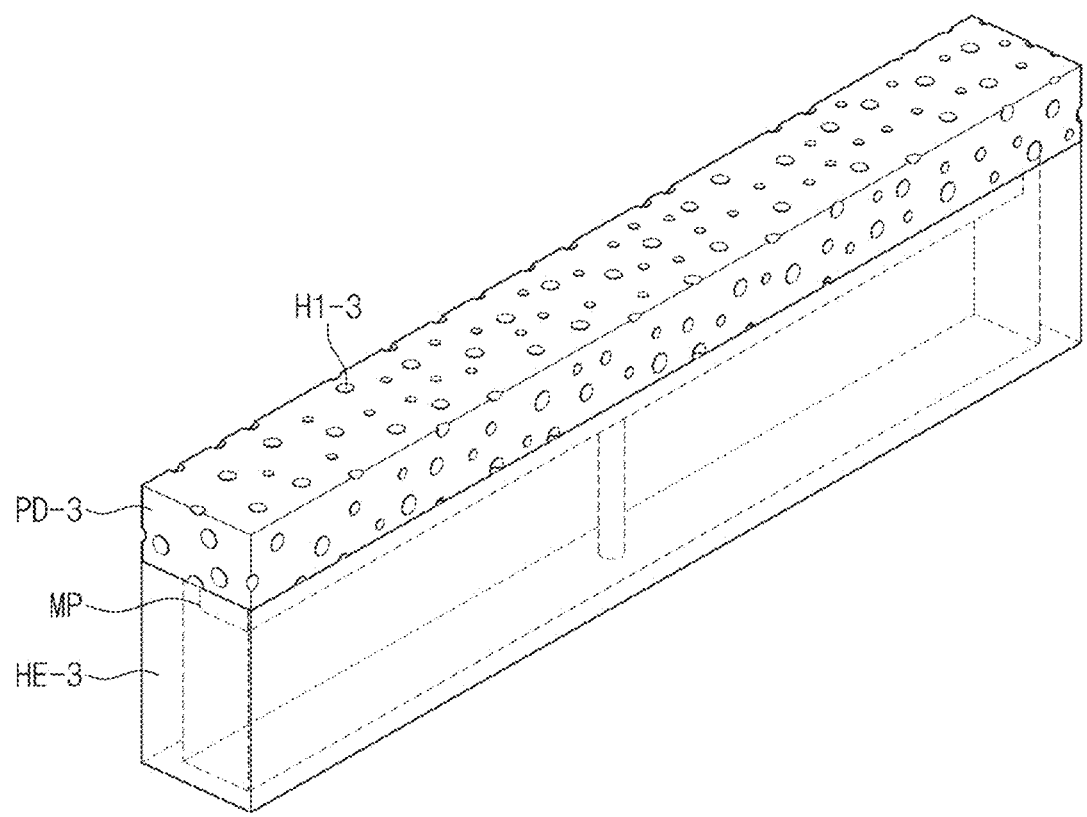

FIGS. 12A and 12B are views illustrating an embodiment of a pad part and a magnet part of a mask chuck according to the invention. For convenience of description, in FIGS. 12A and 12B, a pad part PD-3 and a head part HE-3 are vertically inverted and illustrated.

Referring to FIGS. 12A and 12B, a plurality of first holes H1-3 may be defined in the pad part PD-3. A first upper surface and a first lower surface of the pad part PD-3 may communicate with each other via first holes H1-3. The first upper surface of the pad part PD-3 may be connected to a pneumatic control part.

According to this embodiment, the mask chuck may further include a magnet part MP. The magnet part MP may be disposed between the pad part PD-3 and a base plate BP (refer to FIG. 3). In an embodiment, the magnet part MP may be disposed inside the head part HE-3, for example. The magnet part MP may move inside the head part HE-3. In an embodiment, the magnet part MP may move in the third direction DR3 and move so as to be close to the pad part PD-3 or away from the pad part PD-3, for example.

In this embodiment, the magnet part MP may include a permanent magnet. However, the invention is not limited thereto, and the magnet part MP may also include an electromagnet.

Figure 13A:
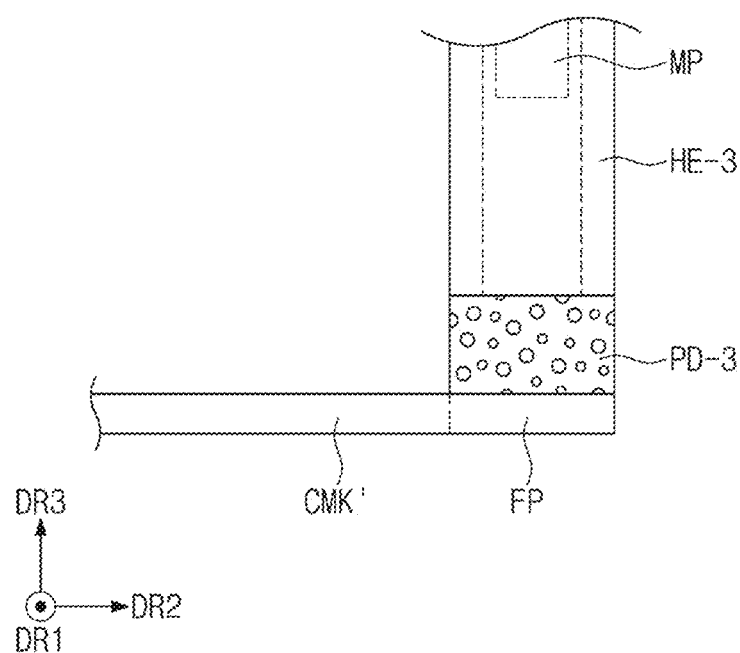
FIGS. 13A and 13B are views illustrating a state in which a mask chuck including a pad part and a magnet part which are illustrated in FIGS. 12A and 12B stretches a cell mask.
Figure 13B:
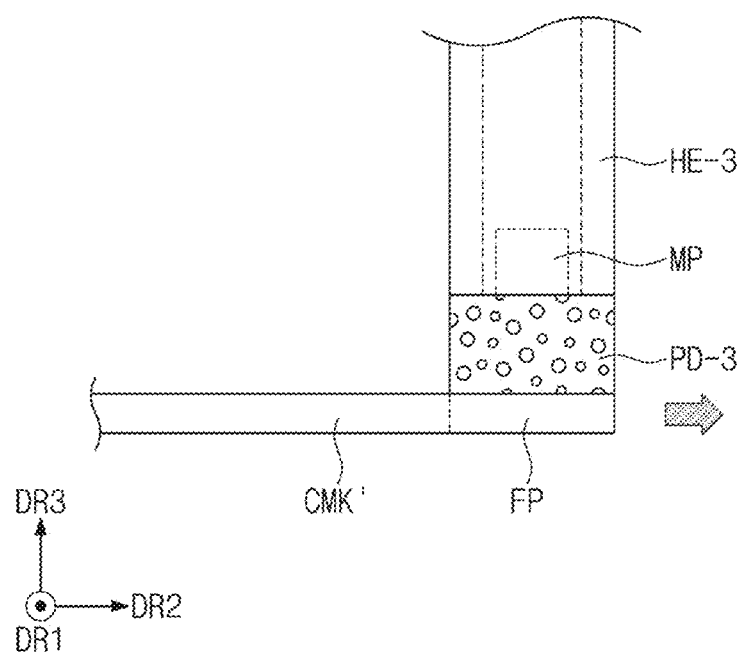

FIGS. 13A and 13B are views illustrating a state, in which a mask chuck including the pad part and the magnet part which are illustrated in FIGS. 12A and 12B, stretches a cell mask.

Referring to FIG. 13A, a pad part PD-3 may contact a wing part FP. A magnet part MP may be disposed at a position spaced apart from the pad part PD-3 in the third direction DR3. A pneumatic control part may fix a wing part FP to the pad part PD-3 through vacuum suction force. The wing part FP may be one among the wing parts FP1 to FP4 illustrated in FIG. 5A.

Referring to FIG. 13B, the magnet part MP may move so as to be close to the pad part PD-3. Ad described above, the wing parts FP may include a metallic material. Accordingly, attractive force may act between the magnet part MP and the wing part FP. Consequently, the attractive force between the pad part PD-3 and the wing part FP may increase.

When the magnet MP is disposed adjacent to the pad part PD-3, the head part HE-3 may move in an outward direction (that is, rightward direction with respect to FIG. 13B). Accordingly, the cell mask CMK' may be stretched.

A mask chuck MC in an embodiment of the invention further includes the magnet part MP which is disposed inside the head part HE-3 so as to be close to or away from the pad part PD-3, and thus may easily control the coupling force between the pad part PD-3 and the wing part FP. In an embodiment, when stretching the cell mask CMK', the magnet part MP is disposed adjacent to the pad part PD-3 and may fix the wing part FP with stronger force, for example. Accordingly, a slip phenomenon between the wing part FP and the pad part PD-3 may be mitigated.

In an embodiment of the invention, a mask chuck may pick a cell mask through a pad part and a transfer part and dispose the cell mask on a mask frame, and also stretch a cell mask through a head part connected to the pad part and moving in an edge region.

So far, the invention has been described in connection with preferred embodiments thereof. However, those of ordinary skill in the art will recognize that various modifications and variations are possible without departing from the spirit and scope set forth in the following claims. In addition, embodiments disclosed herein are not intended to limit the spirit and scope of the invention. Rather, the appended claims and all technical idea within the range equivalent thereto should be understood to be included in the spirit and scope of the invention.

What is claimed is:
1. A mask manufacturing apparatus comprising:
 a stage on which a mask frame in which a cell opening defined is disposed;
 a mask chuck disposed on the stage and configured to dispose a cell mask on a first surface of the mask frame adjacent to the cell opening, the mask chuck comprising:
  a base plate including a central region and an edge region surrounding the central region, the edge region comprising:
   a first edge region extending in a first direction;
   a second edge region extending in the first direction and spaced apart from the first edge region in a second direction crossing the first direction;
   a third edge region extending in the second direction; and
   a fourth edge region extending in the second direction and spaced apart from the third edge region in the first direction, a head part connected to the edge region of the base plate and configured to move on the edge region so as to be close to the central region or away from the central region, the head part comprising:
    a first head part disposed in the first edge region and extending in the first direction;
    a second head part disposed in the second edge region and extending in the first direction;
    a third head part disposed in the third edge region and extending in the second direction; and
    a fourth head part disposed in the fourth edge region and extending in the second direction, and
a pad part disposed on a first surface of the head part, and
an intense-light emitting apparatus configured to irradiate an intense light on a portion between the mask frame and the cell mask.

\* \* \* \* \*